United States Patent [19]

Shigetomi et al.

[11] Patent Number: 4,738,907

[45] Date of Patent: Apr. 19, 1988

[54] PROCESS FOR MANUFACTURING A PHOTOMASK

[75] Inventors: Akira Shigetomi; Shuichi Matsuda, both of Itami, Japan

[73] Assignee: Mitsubishi Denki Kabushiki Kaisha, Tokyo, Japan

[21] Appl. No.: 841,469

[22] Filed: Mar. 20, 1986

[30] Foreign Application Priority Data

May 29, 1985 [JP] Japan ................... 60-115863

[51] Int. Cl.⁴ ............................................. G03F 9/00
[52] U.S. Cl. ........................................ 430/5; 430/296;
 430/321; 430/323; 430/942; 428/428
[58] Field of Search ............... 430/5, 323, 942, 296,
 430/321, 632, 432; 428/428

[56] References Cited

U.S. PATENT DOCUMENTS 4,661,426  4/1987  Matsuda et al. ................... 430/5
4,678,714  7/1987  Watakabe ........................ 428/432

FOREIGN PATENT DOCUMENTS 56-42176  3/1981  Japan.
56-42183  3/1981  Japan.

Primary Examiner—John E. Kittle
Assistant Examiner—José G. Dees
Attorney, Agent, or Firm—Lowe, Price, LeBlanc, Becker & Shur

[57] ABSTRACT

A photomask manufacturing process including step of forming on a transparent silica glass substrate a silicide film in which an alloy comprising two or more metal elements is silicidized. A resist is applied onto the silicide film and then a patterning mask is provided by light or electron beam, followed by developing step. Exposed portion of the silicide film is etched away using a dry etching process.

3 Claims, 3 Drawing Sheets

PROCESS FOR MANUFACTURING A PHOTOMASK

BACKGROUND OF THE INVENTION

1. Field of the Invention

The present invention relates to a process for manufacturing a photomask and, more particularly, to a process for manufacturing a photomask for use with manufacture of a semiconductor device.

2. Description of the Prior Art

FIGS. 1A to 1D show sequential steps of a conventional photomask manufacturing process. First of all, a conventional process of manufacturing a photomask will be described with reference to FIGS. 1A to 1D. First, as shown in FIG. 1A, a transparent glass substrate 1 is prepared and then a metal mask material 2 such as chromium is formed on the transparent glass substrate 1 by means of evaporation process, sputtering process or the like, with a thickness of 800–1000Å. Then, as shown in FIG. 1B, a resist 3 is applied onto the metal mask material 2, a desired pattern is drawn by light or electron beam and then developing process is achieved, so that a resist pattern can be formed. Thereafter, as shown in FIG. 1C, exposed portion of the metal mask material 2 such as chromium is etched away by a gas plasma process and the like and then the resist pattern is removed, so that a photomask called a hard mask, is formed as shown in FIG. 1D.

In an earlier time, a mask used for manufacturing a semiconductor device included a photography emulsion dry plate using a transparent glass substrate. However, with advance of high integration and fining, a hard mask including a transparent glass substrate and a metal film such as chromium formed on the glass substrate has been widely used. More particularly, in case of a hard mask such as chromium, a thinner film of chromium can be used, as compared with a conventional emulsion mask and hence it becomes possible to obtain a finer pattern and lifetime of mask becomes longer.

However, at the same time, an etching technique of a metal mask material 2 of a hard mask such as chromium is important. In a case where a metal film is made of chromium, a wet chemical etching process is generally used, in which a mixture solution of ammonium cerium (V) nitrate and perchloric acid is employed. On the other hand, with advance of technique for fining a pattern, a dry etching technique has been developed and utilized, in which a gas plasma or reactive ion etching is employed. In case of a plasma etching of chromium, a chromium is etched by glow-discharging a mixed gas containing a halogen element such as chlorine and oxygen, with the reaction being considered as follows;

$$Cr + 2O + 2Cl \rightarrow CrO_2Cl_2$$

As described in the foregoing, a hard mask of chromium and the like is advantageous for forming a fine pattern, while there is a disadvantage that a rate of etching, particularly a dry etching using a gas plasma, is low. More particularly, in case of chromium, the etching rate is about 100Å/min is a condition of 300W and 0.2 Torr and 8–10 minutes of etching time is required (in case of 800–1000Å in thickness). In addition, reduction of thickness of resist film due to a longer time required for etching is also a problem.

Incidentally, Japanese patent application No. 42176/1981, filed Mar. 23, 1981 and laid open for public inspection Sept. 28, 1982 and Japanese patent application No. 42183/1981, filed Mar. 23, 1981 and laid open for public inspection Sept. 28, 1982 disclose that a silicon layer and a metal layer are deposited on a glass substrate so that a pattern of silicide is formed by an electron beam.

SUMMARY OF THE INVENTION

Accordingly, a principal object of the present invention is to eliminate the above described defects and to provide a process of manufacturing a photomask which can be easily etched by a dry etching.

Briefly stated, the present invention is directed to a process for manufacturing a photomask comprising the steps of preparing a transparent glass substrate, forming on the transparent glass substrate a silicide film in which an alloy comprising two or more metal elements is silicidized, applying a resist on the silicide film, providing a mask pattern by light or electron beam and developing the pattern so that some portion of the applied resist can be removed, and etching away the exposed portion of the silicide film by means of dry etching process.

According to the present invention, an etching rate of mask material becomes larger and a good joining ability between the mask material and a substrate can be obtained, because a silicide film in which an alloy comprising two or more metal elements is silicidized is used as a mask material for forming a mask pattern.

According to a preferred embodiment of the present invention, the transparent glass substrate is a silica glass substrate and the alloy for silicide film is titanium-molybdenum or titanium-molybdenum-tungsten.

These objects and other objects, features, aspects and advantages or the present invention will become more apparent from the following detailed description of the present invention when taken in conjunction with the accompanying drawings.

DESCRIPTION OF THE PREFERRED EMBODIMENTS

Figure 1A:
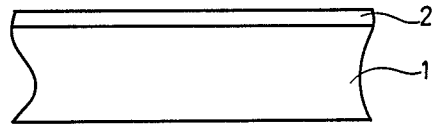
FIGS. 1A through 1D are drawings for explaining a conventional process of manufacturing a photomask.
Figure 1B:
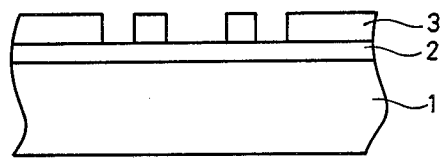
Figure 1C:
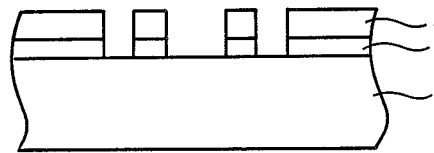
Figure 1D:
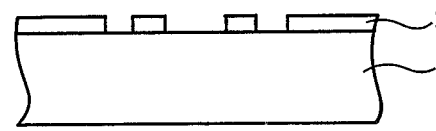
Figure 2A:
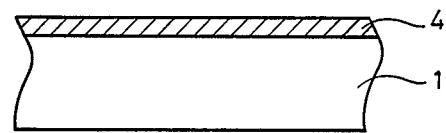
FIGS. 2A to 2D are drawings for explaining a process of manufacturing a photomask of the present invention.
Figure 2B:
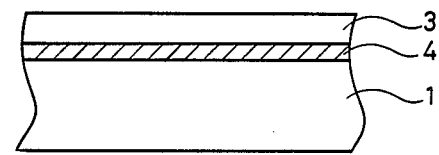
Figure 2C:
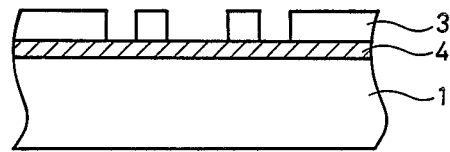
Figure 2D:
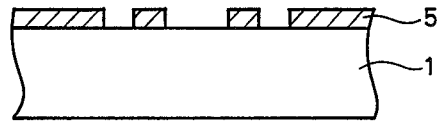

FIGS. 2A to 2D are cross sectional views showing a process of manufacturing a photomask of one embodiment of the present invention. First of all, referring to FIG. 2A, a transparent glass substrate 1, such as a silica glass, is prepared and then a silicide film 4 in which an alloy of molybdenum (Mo) - titanium (Ti) or an alloy of molybdenum (Mo) - titanium (Ti) - tungsten (W) is silicidized is formed on the transparent glass substrate 1, with about 1000Å in thickness, using a sputtering process of electron beam and the like in which molybdenum and titanium or molybdenum, titanium and tungsten are used as a target. Then, referring to FIG. 2B, a resist 3 is applied onto the silicide film 4. Thereafter, a desired pattern is drawn by light or electron beam so that a resist pattern 3 is formed, as shown in FIG. 2C. Then, following the processes of development and baking, the exposed portion of the silicide 4 is etched away using dry etching process and then the resist pattern 3 is removed, so that a mask pattern of an alloy silicide is formed, completing the formation of a photomask for use in a process of a semiconductor device.

Figure 3:
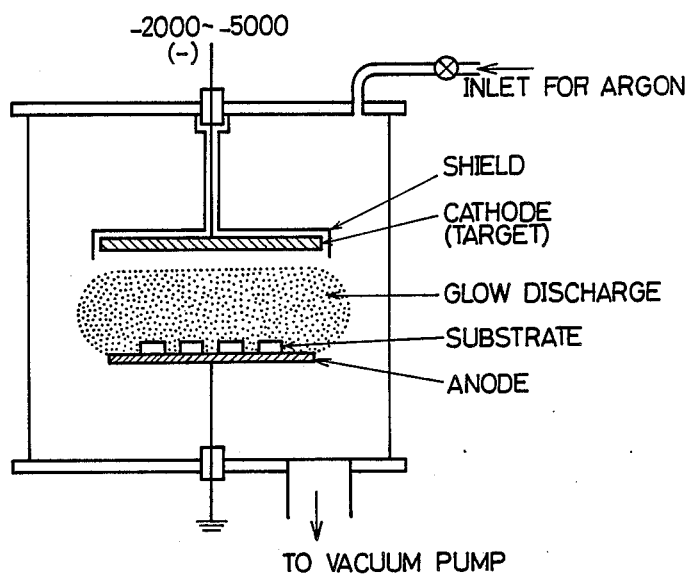
FIG. 3 is a schematic diagram showing a direct current two-polarity type of sputtering apparatus.

FIG. 3 is a schematic diagram showing a direct current two-polarity type of sputtering apparatus which may be used for manufacturing a photomask of the present invention. In this apparatus, a negative voltage of $-2$ to $-5$kV is applied to a cathode electrode which is a target, while argon with $10^{-2}$ Torr is being applied. As a result, a glow-discharge occurs in a chamber and a positive ions in the plasma are accelerated by a strong electric field in a dark portion in front of the cathode to bombard the cathode so that atoms are removed from the target. These atoms deposit on the surface of the substrate so that a thin film can be formed on the substrate. Apart from the above described sputtering process, a high frequency sputtering process is also well known in which a plasma is generated by using a high frequency. At any rate, in these sputtering process, molybdenum and titanium or molybenum, titanium and tungsten are used as a target in accordance with the present invention.

Use of metal (alloy) silicide film 4 as a mask material permits the provision of photomask with a good quality, since a dry etching process can be easily used and joining ability between a transparent glass substrate 1 and a mask material increases. In case where a pattern is drawn by light or electron beam after application of a photo resist or an electron beam resist onto the transparent glass substrate 1 with thickness of 4000–6000Å, a value of resistance of the metal (alloy) silicide film 4 is about 100 Ohms and hence there is no charge up phenomenon in an electron beam drawing. A dry etching process is applied more easily to the metal silicide film 4, as compared with a chromium film. For example, in case of metal (alloy) silicide film 4 of molybdenum (Mo) and titanium (Ti), an etching rate of about 500–1000Å/min is obtained, with a mixed gas of $CF_4+O_2$ (2%), vacuum of 0.3 Torr and 300 W, which rate is about 5 to 10 times the conventional dry etching rate for chromium film. This sufficiently meets requirement of mass production and to that end, size control can be made easier.

In addition, since the metal silicide film 4 contains a silicon (Si) as a main constituent element, the film 4 is much familiar with a silica substrate including $SiO_2$, $Al_2O_3$ or the like and hence there is no problem in which mask pattern is stripped off the substrate, which can produce a photomask with high reliability.

As described in the foregoing, according to the present invention, a transparent glass substrate such as silica glass is used and a metal silicide film is formed on the transparent substrate, so that a dry etching process can be used with ease, whereby mass production of photomask with high accuracy and high reliability becomes possible.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A process for manufacturing a photomask comprising the steps of:
   preparing a transparent glass substrate;
   forming on said transparent glass substrate a silicide film in which an alloy comprising two or more metal elements is silicidized;
   applying a resist on said metal silicide film;
   drawing a desired mask pattern on the resist by using light or electron beam and developing the pattern so that some portion of the applied resist can be removed and the corresponding portion of the silicide film can be exposed; and
   etching away the exposed portion of said silicide film by means of dry etching process.

2. A process for manufacturing a photomask in accordance with claim 1, wherein
   said transparent glass substrate is a silica glass substrate, and
   said alloy is a titanium-molybdenum alloy.

3. A process for manufacturing a photomask in accordance with claim 1, wherein
   said transparent glass substrate is a silica glass substrate, and
   said alloy is a titanium-molybdenum-tungsten alloy.

* * * * *